United States Patent [19]

Jones

[11] 4,368,689

[45] Jan. 18, 1983

[54] BEAM SOURCE FOR DEPOSITION OF THIN FILM ALLOYS

[75] Inventor: Addison B. Jones, Yorba Linda, Calif.

[73] Assignee: Rockwell International Corporation, El Segundo, Calif.

[21] Appl. No.: 220,397

[22] Filed: Dec. 29, 1980

[51] Int. Cl.³ .............................................. C23C 13/02
[52] U.S. Cl. .................................. 118/688; 118/694; 118/712; 118/715; 118/723
[58] Field of Search ............... 118/688, 694, 712, 715, 118/723; 427/8, 42

[56] References Cited

U.S. PATENT DOCUMENTS 4,237,148  12/1980  Aichert et al. ..................... 427/42

*Primary Examiner*—James R. Hoffman

*Attorney, Agent, or Firm*—H. Fredrick Hamann; Wilfred G. Caldwell

[57] ABSTRACT

The invention is an apparatus and method for achieving thin film deposition, of uniform composition, from evaporated alloys. A source of wire alloy, selected for the particular thin film deposition on a substrate, is continuously fed through a region of high speed electron bombardment confined to an end of the wire, for evaporation of the wire in the vicinity of the substrate. An ion flux detector controls the rate of feeding of the wire source in accordance with the detected flux to lay down a uniform thin film of predetermined thickness. A high potential is established between the wire and the source of the electrons and the liberated electrons are guided by the electric field toward the end of the wire being evaporated, which serves as an anode.

8 Claims, 1 Drawing Figure

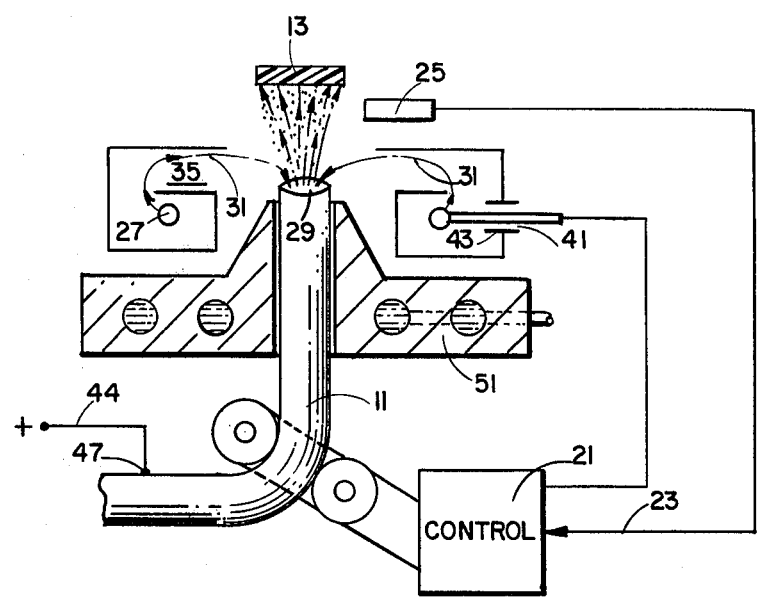

BEAM SOURCE FOR DEPOSITION OF THIN FILM ALLOYS

FIELD OF THE INVENTION

The present invention relates to the deposition of thin films of an alloy of given composition by bombarding a wire source of such alloy adjacent an end thereof by high speed electrons and detecting the ion flux generated in the vicinity of a substrate being coated to provide a speed control for advancement of the wire.

PRIOR ART

It is conventional to evaporate alloys for thin film deposition but constituents of the alloy frequently have different vapor pressures at the evaporation temperatures, and the deposited film will have different composition than the source. Also, the deposited film composition will change as the deposition proceeds. Another means for achieving evaporation has been utilized to employ a source of wire fed into a hot plate. However, limitations to this process involve the necessary selection of but a few types of material which may be evaporated by considering the melting point of the alloy and chemical reactivity of the plate. Also, thermal radiation from the plate is another limiting factor.

SUMMARY OF THE INVENTION

The invention comprises a method and apparatus for thin film deposition wherein a source of alloy wire of the composition of the thin film to be deposited is provided for moving an end thereof through a high potential region wherein high speed electrons are caused to bombard or impact the end of the wire to vaporize it onto a substrate, and means are provided for controlled advancing of the wire, as it is utilized.

BRIEF DESCRIPTION OF THE FIGURE

The single FIGURE shows an arrangement for illustrating the apparatus utilized and the method of achieving the thin film deposition from a wire comprised of the alloy intended to be deposited.

DESCRIPTION OF THE PREFERRED EMBODIMENT

In the FIGURE, there is shown a wire 11 selected for alloys for the particular thin film deposition required to coat substrate 13. The wire 11 is driven by rollers 15 and 17 connected by driving belt 19 to control 21 which may simple comprise a conventional speed control. The speed control 21 is actuated via lead 23 which extends to ion flux detector 25. Other types of deposition rate monitor, such as a micro balance of quarte crystal oscillator, may be used in lieu of the ion flux detector. A threshold or minimum may be set at flux detector 25 below which the source wire 11 is no moved, but above which it is moved to furnish fresh wire to the evaporating region. Of course, the system may use continuous detection and continuous advancing through variable speed control. The deposition rate signal may also be used to control power to the filament. But in any event only commercially available devices are employed for the detector and control and thus do not form any unique elements in the proposed method and combination subject matter.

Control 21 may also comprise the power control source for the electron source via lead 41 and the detection signal may be used to control electron bombardment.

The electron source comprises the filament 27 which is preferably concentrically disposed with respect to the source wire 11, but may comprise shorter lengths of filament wire deployed in a suitable manner to bombard the end 29 of the wire 11 being fed forwardly into the field of electrons, shown by the traces 31, as leaving the filament 27 and bombarding the end 29 of wire 11.

A shield 33 is included around the filament 27 with an opening 35 provided to guide the electrons in the direction of the wire end 29. An electrical lead 41 extends to filament 27 and penetrates shield 33 at opening 43. However, it is usually desirable to have the shield 33 at the same potential as the filament 27. This potential may be ground or may be several thousand electron volts below ground. The other lead 44 is shown extending from a positive or zero source to a tiny roller or slider 47 in contact with source wire 11. In any event, it is only n necessary that the source of electrons 27 be several thousand electron volts negative relative to the potential of the source wire 11 for the electrons to be attracted to the latter as the anode for high speed impact therewith.

Optionally, a water cooled sleeve 51 is provided about the wire 11 and extends toward end 29. This prevents the wire 11 from melting except where intended at the point of impact.

Thus, the concept of continuous feed of the wire source of the same composition as the desired thin film has been described. The evaporation is accomplished by direct bombardment and heating of the wire source of electrons. Particularly important applications for this approach involve the use of silicon and copper doped aluminum and permalloy.

Other innovations of control are readily available (e.g) detector 25 may be a menisus detector or a pyrometer and either signal therefrom may be used to control speed advance for wire 11 or power to filament 11 or source power between leads 41 and 44.

While modifications of this preferred embodiment will occur to those skilled in the art, nevertheless the principles of the invention are incorporated in the appended claims which are intended to define the scope of this invention.

What is claimed is:

1. A thin film alloy deposition source, comprising in combination:
   a source of alloy wire;
   impacting means comprising electrons and a source of high voltage therefor with said source being at a negative potential relative to said wire;
   means for advancing the wire to attain the desired deposition rate;
   detector means for measuring deposition rate in the vicinity of said end of the wire; and,
   said means for advancing controlling wire feed in response to said detector means.
2. The source of claim 1, further comprising:
   means for controlling electron bombardment power of said source in response to said detector means.
3. The source of claim 1, wherein:
   said means for impacting comprising shield means at the potential of the electron source means for guiding the electrons toward said end of the wire.
4. The source of claim 3, further comprising water cooled sleeve means adjacent said wire near said end to serve as heat transfer means for the wire other than said end.

5. A thin film alloy deposition source, comprising in combination:
a source of alloy wire;
means for impacting the wire adjacent to and at an end thereof by high speed particles to vaporize it;
means for advancing the wire to attain the desired deposition rate; and,
detector and control means monitoring the height of the wire end to control wire advance.

6. A thin film alloy deposition source, comprising in combination:
a source of alloy wire;
means for impacting the wire adjacent to and at an end thereof by high speed particles to vaporize it;
means for advancing the wire to attain the desired deposition rate; and,
detector and control means monitoring the temperature of the wire end to control wire advance.

7. A thin film alloy deposition source, comprising in combination:
a source of alloy wire;
means for impacting the wire adjacent to and at an end thereof by high speed particles to vaporize it;
means for advancing the wire to attain the desired deposition rate; and,
detector means monitoring a characteristic of the wire end; and control means responsive to the detector means for controlling power to the electron source.

8. A thin film alloy deposition source, comprising in combination:
a source of alloy wire;
means for impacting the wire adjacent to and at an end thereof by high speed particles to vaporize it;
means for advancing the wire to attain the desired deposition rate; and,
detector means monitoring the deposition rate; and control means responsive to the detector means to control power to the electron source.

* * * * *

UNITED STATES PATENT AND TRADEMARK OFFICE
CERTIFICATE OF CORRECTION

PATENT NO. : 4,368,689

DATED : January 18, 1983

INVENTOR(S) : Addison B. Jones

It is certified that error appears in the above-identified patent and that said Letters Patent are hereby corrected as shown below:

Page 1, change title to read --E BEAM SOURCE FOR DEPOSITION OF THIN FILM ALLOYS--.

Column 1, line 38 change [BRIEF DESCRIPTION OF THE FIGURE] to read ---BRIEF DESCRIPTION OF THE DRAWING---.

Column 1, line 47, last word, change [for] to read ---from---.

Column 1, line 54, change [of] to read ---or---.

Column 1, line 57, change [no] to read ---not---.

Column 1, line 1, change title to read ---E BEAM SOURCE FOR DEPOSITION OF THIN FILM ALLOYS---.

Signed and Sealed this

Twenty-ninth Day of November 1983

[SEAL]

Attest:

Attesting Officer

GERALD J. MOSSINGHOFF

Commissioner of Patents and Trademarks